United States Patent [19]

Branovich et al.

[11] 4,327,131

[45] Apr. 27, 1982

[54] METHOD OF COATING A CERAMIC SUBSTRATE

[75] Inventors: Louis E. Branovich, Howell Township, Monmouth County; Edward Daly, Keyport, both of N.J.; Albert F. Newman, Sun City, Ariz.; Willis M. Smith, Fair Haven, N.J.

[73] Assignee: The United States of America as represented by the Secretary of the Army, Washington, D.C.

[21] Appl. No.: 213,435

[22] Filed: Dec. 5, 1980

[51] Int. Cl.³ .............................................. B05D 3/02
[52] U.S. Cl. .................................. 427/229; 427/314; 427/377; 427/383.5
[58] Field of Search ............... 427/229, 314, 379, 377, 427/226, 383.5

[56] References Cited

U.S. PATENT DOCUMENTS

| | | | |
|---|---|---|---|
| 2,893,891 | 7/1959 | Bradstreet et al. | 427/229 |
| 2,979,424 | 4/1961 | Whitehurst et al. | 427/229 |
| 3,288,634 | 11/1966 | Spacil | 427/229 |
| 3,607,681 | 9/1971 | Cooke et al. | 427/229 |

*Primary Examiner*—Norman Morgenstern
*Assistant Examiner*—Janyce A. Bell
*Attorney, Agent, or Firm*—Nathan Edelberg; Jeremiah G. Murray; Roy E. Gordon

[57] ABSTRACT

A ceramic substrate is rapidly coated with a uniform coating of copper by heating the ceramic substrate to about 250° C., adding an aqueous slurry of an inorganic copper salt to the ceramic substrate at that temperature, and heating the coated ceramic in a reducing atmosphere at about 800° C.

10 Claims, No Drawings

METHOD OF COATING A CERAMIC SUBSTRATE

The invention described herein may be manufactured, used, and licensed by or for the Government for governmental purposes without the payment to us of any royalty thereon.

This invention relates in general to a method of coating a ceramic substrate and in particular to a method of rapidly coating a ceramic substrate with a uniform coating of copper.

BACKGROUND OF THE INVENTION

Heretofore, the coating of copper onto ceramics has involved conventional time consuming techniques such as sputtering, arc plasma spraying, and thermal evaporation. Some of these techniques require the application of vacuum and special preparation such as firing of the substrate.

SUMMARY OF THE INVENTION

The general object of this invention is to provide a method of coating copper onto a ceramic substrate. A more particular object of the invention is to provide such a method that will be rapid and result in a uniform coating of copper on the ceramic substrate. A particular object of the invention is to provide a rapid method of coating a beryllium oxide substrate with a uniform coating of copper.

The aforementioned objects have not been attained by a method involving heating the ceramic to about 250° C., adding an aqueous slurry of an inorganic copper salt to the ceramic at that temperature, and heating the coated ceramic in a reducing atmosphere at about 800° C.

DESCRIPTION OF THE PREFERRED EMBODIMENT

Beryllium oxide substrates are placed on a hot plate at a temperature of about 250° C. An aqueous slurry of cuprous chloride is then prepared by mixing cuprous chloride with water and the slurry then added to the hot beryllium oxide ceramic. The water from the slurry when placed on the hot beryllium oxide ceramic evaporates leaving an intermediate coating of copper oxide on the ceramic. The beryllium oxide ceramic coated with copper oxide is then placed in a quartz boat which in turn, is placed in a hydrogen furnace at 800° C. After only fifteen minutes, the sample is removed from the furnace and allowed to cool. The cooper oxide coating has been converted to a uniform layer of copper deposited on the beryllium oxide substrate.

In the above described embodiment, other ceramic substrates such as aluminum oxide and boron nitride can be used in place of beryllium oxide. Similarly, other inorganic copper salts such as malachite and copper nitrate can be used instead of cuprous chloride.

The amount of inorganic copper salt to be used in forming the slurry is dependent on the thickness of the copper film desired. That is, the more concentrated the slurry the thicker the copper film will be.

The reducing atmosphere at an elevated temperature can be supplied by a suitable reaction chamber as for example, a hydrogen furnace.

It is to be noted that by using the method of the invention, a known thickness of copper can be deposited as a uniform coating in a very short time.

We wish it to be understood that we do not desire to be limited to the exact details as described, for obvious modifications will occur to a person skilled in the art.

What is claimed is:

1. Method of rapidly coating a ceramic substrate with a uniform coating of copper, said method including the steps of
   (A) heating the ceramic to about 250° C.
   (B) placing an aqueous slurry of an inorganic copper salt selected from the group consisting of cuprous chloride and malachite on the ceramic at that temperature, and
   (C) heating the coated ceramic in a reducing atmosphere at about 800° C.

2. Method according to claim 1 wherein the ceramic is selected from the group consisting of aluminum oxide, beryllium oxide, and boron nitride.

3. Method according to claim 2 wherein the ceramic is aluminum oxide.

4. Method according to claim 2 wherein the ceramic is beryllium oxide.

5. Method according to claim 2 wherein the ceramic is boron nitride.

6. Method according to claim 1 where the inorganic copper salt is cuprous chloride.

7. Method according to claim 1 wherein the inorganic copper salt is malachite.

8. Method according to claim 1 wherein the reducing atmosphere is supplied by a hydrogen furnace.

9. Method according to claim 1 wherein the ceramic substrate is a beryllium oxide substrate and the copper salt is cuprous chloride.

10. Method of rapidly coating a beryllium oxide substrate with a uniform coating of copper, said method consisting of placing a beryllium oxide substrate on a hot plate at about 250° C., placing an aqueous slurry of cuprous chloride on the beryllium oxide substrate at that temperature, heating the beryllium oxide coated substrate in a quartz boat in a hydrogen furnace at about 800° C. for about 15 minutes, and removing the sample from the hydrogen furnace.

* * * * *